(12) United States Patent
Yu et al.

(10) Patent No.: US 9,136,143 B2
(45) Date of Patent: Sep. 15, 2015

(54) THERMALLY ENHANCED STRUCTURE FOR MULTI-CHIP DEVICE

(71) Applicant: Taiwan Semiconductor Manufacturing Company, Ltd., Hsin-Chu (TW)

(72) Inventors: Chen-Hua Yu, Hsin-Chu (TW);
Chih-Hang Tung, Hsin-Chu (TW);
Tung-Liang Shao, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 39 days.

(21) Appl. No.: 13/919,165

(22) Filed: Jun. 17, 2013

(65) Prior Publication Data

US 2013/0277840 A1 Oct. 24, 2013

Related U.S. Application Data

(62) Division of application No. 13/224,487, filed on Sep. 2, 2011, now Pat. No. 8,531,032.

(51) Int. Cl.
| | |
|---|---|
| *H01L 23/498* | (2006.01) |
| *H01L 21/48* | (2006.01) |
| *H01L 23/31* | (2006.01) |
| *H01L 23/36* | (2006.01) |
| *H01L 23/367* | (2006.01) |
| *H01L 23/00* | (2006.01) |
| *H01L 25/065* | (2006.01) |
| *H01L 23/532* | (2006.01) |

(52) U.S. Cl.
CPC ........ *H01L 21/4871* (2013.01); *H01L 23/3114* (2013.01); *H01L 23/36* (2013.01); *H01L 23/3677* (2013.01); *H01L 23/49816* (2013.01); *H01L 24/19* (2013.01); *H01L 25/0657* (2013.01); *H01L 23/5329* (2013.01); *H01L 2224/12105* (2013.01); *H01L 2224/16145* (2013.01); *H01L 2224/16225* (2013.01); *H01L 2224/32145* (2013.01); *H01L 2224/73253* (2013.01); *H01L 2224/73259* (2013.01); *H01L 2224/73267* (2013.01); *H01L 2225/06513* (2013.01); *H01L 2225/06589* (2013.01); *H01L 2924/15321* (2013.01)

(58) Field of Classification Search
USPC ........................................................ 438/106
See application file for complete search history.

(56) References Cited

U.S. PATENT DOCUMENTS

| | | |
|---|---|---|
| 4,811,082 A | 3/1989 | Jacobs et al. |
| 4,990,462 A | 2/1991 | Sliwa, Jr. |
| 5,075,253 A | 12/1991 | Sliwa, Jr. |
| 5,380,681 A | 1/1995 | Hsu |
| 5,477,082 A * | 12/1995 | Buckley et al. ............... 257/679 |
| 5,481,133 A | 1/1996 | Hsu |

(Continued)

*Primary Examiner* — Thao P Le
(74) *Attorney, Agent, or Firm* — Slater & Matsil, L.L.P.

(57) ABSTRACT

A multi-chip semiconductor device comprises a thermally enhanced structure, a first semiconductor chip, a second semiconductor chip, an encapsulation layer formed on top of the first semiconductor chip and the second semiconductor chip. The multi-chip semiconductor device further comprises a plurality of thermal vias formed in the encapsulation layer. The thermally enhanced structure comprises a heat sink block attached to a first semiconductor die. The heat sink block may further comprise a variety of thermal vias and thermal openings. By employing the thermal enhanced structure, the thermal performance of the multi-chip semiconductor device can be improved.

18 Claims, 16 Drawing Sheets

(56) References Cited

U.S. PATENT DOCUMENTS

| | | |
|---|---|---|
| 6,002,177 A | 12/1999 | Gaynes et al. |
| 6,084,308 A * | 7/2000 | Kelkar et al. ............... 257/777 |
| 6,187,678 B1 | 2/2001 | Gaynes et al. |
| 6,229,216 B1 | 5/2001 | Ma et al. |
| 6,236,115 B1 | 5/2001 | Gaynes et al. |
| 6,265,771 B1 | 7/2001 | Ference et al. |
| 6,271,059 B1 | 8/2001 | Bertin et al. |
| 6,279,815 B1 | 8/2001 | Correia et al. |
| 6,355,501 B1 | 3/2002 | Fung et al. |
| 6,434,016 B2 * | 8/2002 | Zeng et al. ................. 361/760 |
| 6,448,661 B1 | 9/2002 | Kim et al. |
| 6,461,895 B1 | 10/2002 | Liang et al. |
| 6,562,653 B1 | 5/2003 | Ma et al. |
| 6,570,248 B1 | 5/2003 | Ahn et al. |
| 6,600,222 B1 | 7/2003 | Levardo |
| 6,607,938 B2 | 8/2003 | Kwon et al. |
| 6,661,085 B2 | 12/2003 | Kellar et al. |
| 6,762,076 B2 | 7/2004 | Kim et al. |
| 6,790,748 B2 | 9/2004 | Kim et al. |
| 6,887,769 B2 | 5/2005 | Kellar et al. |
| 6,908,565 B2 | 6/2005 | Kim et al. |
| 6,908,785 B2 | 6/2005 | Kim |
| 6,924,551 B2 | 8/2005 | Rumer et al. |
| 6,943,067 B2 | 9/2005 | Greenlaw |
| 6,946,384 B2 | 9/2005 | Kloster et al. |
| 6,975,016 B2 | 12/2005 | Kellar et al. |
| 7,037,804 B2 | 5/2006 | Kellar et al. |
| 7,056,807 B2 | 6/2006 | Kellar et al. |
| 7,087,538 B2 | 8/2006 | Staines et al. |
| 7,151,009 B2 | 12/2006 | Kim et al. |
| 7,157,787 B2 | 1/2007 | Kim et al. |
| 7,173,329 B2 * | 2/2007 | Frutschy et al. .............. 257/698 |
| 7,215,033 B2 | 5/2007 | Lee et al. |
| 7,276,799 B2 | 10/2007 | Lee et al. |
| 7,279,795 B2 | 10/2007 | Periaman et al. |
| 7,307,005 B2 | 12/2007 | Kobrinsky et al. |
| 7,317,256 B2 | 1/2008 | Williams et al. |
| 7,320,928 B2 | 1/2008 | Kloster et al. |
| 7,345,350 B2 | 3/2008 | Sinha |
| 7,402,442 B2 | 7/2008 | Condorelli et al. |
| 7,402,515 B2 | 7/2008 | Arana et al. |
| 7,410,884 B2 | 8/2008 | Ramanathan et al. |
| 7,432,592 B2 | 10/2008 | Shi et al. |
| 7,494,845 B2 | 2/2009 | Hwang et al. |
| 7,528,494 B2 | 5/2009 | Furukawa et al. |
| 7,531,890 B2 | 5/2009 | Kim |
| 7,557,597 B2 | 7/2009 | Anderson et al. |
| 7,576,435 B2 | 8/2009 | Chao |
| 7,834,450 B2 | 11/2010 | Kang |
| 2007/0164449 A1 * | 7/2007 | Wang ............................ 257/778 |
| 2007/0190690 A1 * | 8/2007 | Chow et al. .................. 438/113 |
| 2007/0278660 A1 * | 12/2007 | Han et al. ..................... 257/698 |
| 2008/0116569 A1 * | 5/2008 | Huang et al. ................. 257/712 |
| 2008/0265400 A1 | 10/2008 | Pan et al. |
| 2009/0294947 A1 | 12/2009 | Tain et al. |
| 2010/0187683 A1 * | 7/2010 | Bakir et al. .................. 257/713 |
| 2010/0213604 A1 * | 8/2010 | Smeys et al. ................. 257/700 |

* cited by examiner

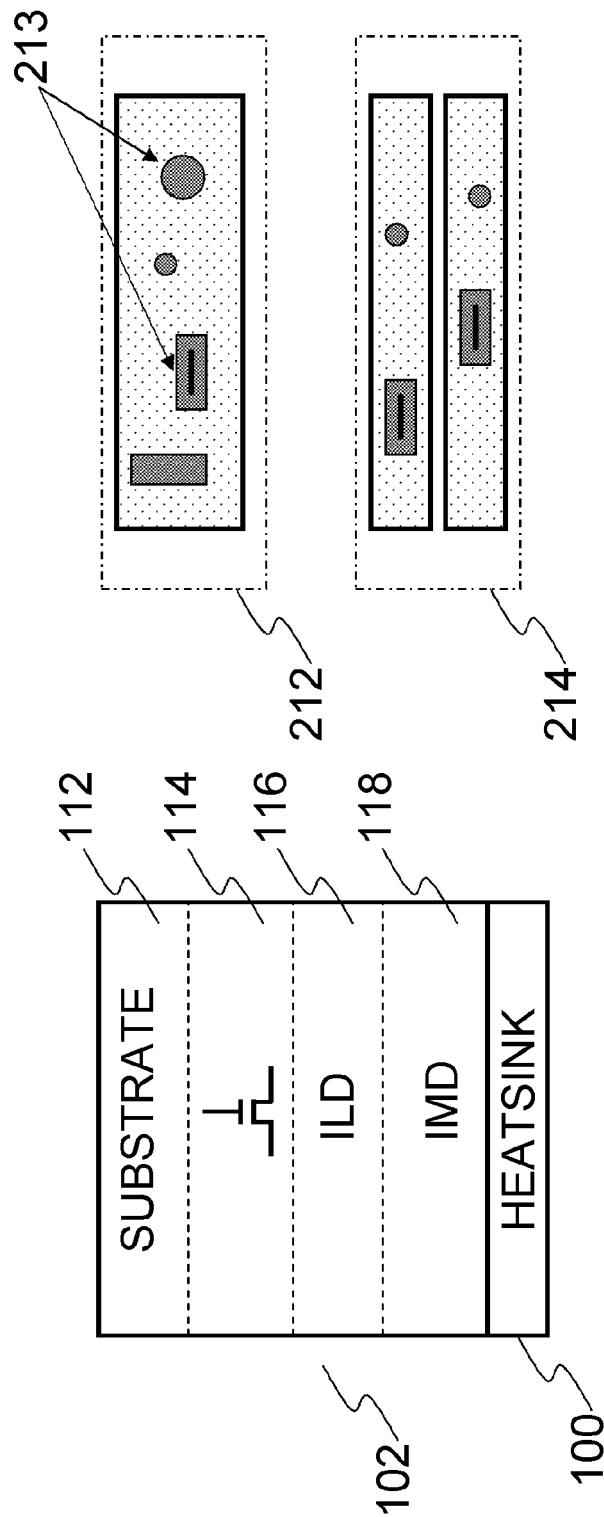

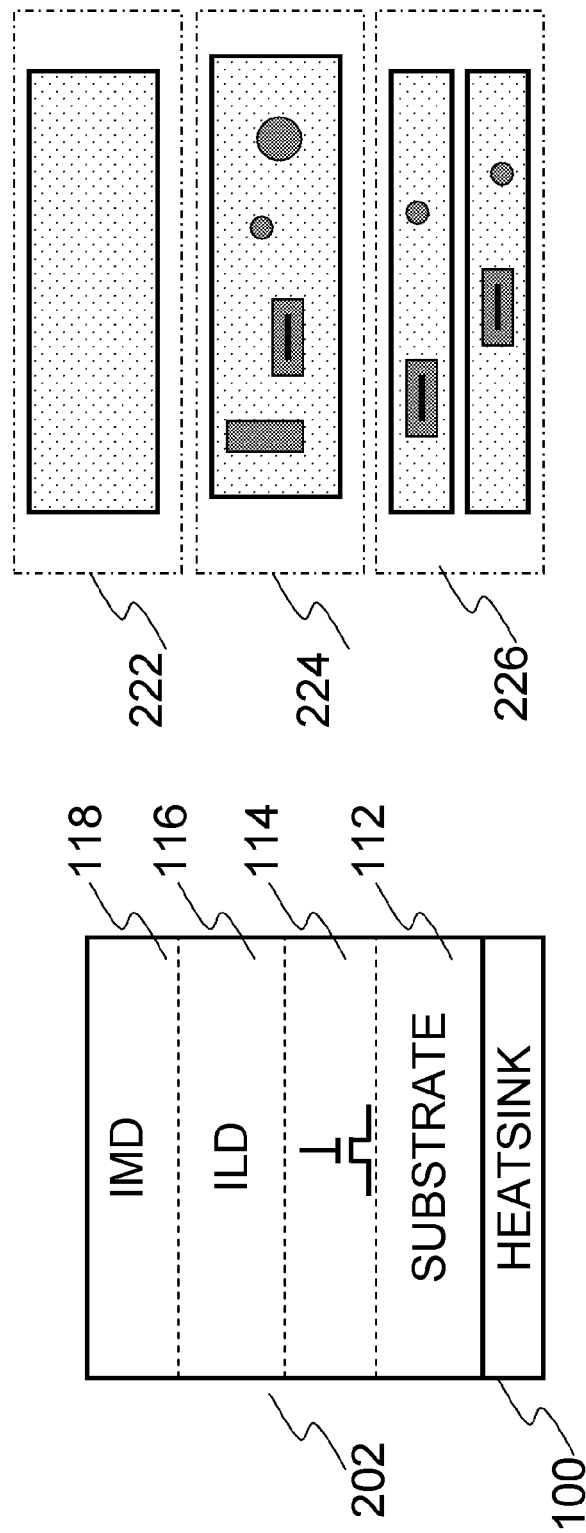

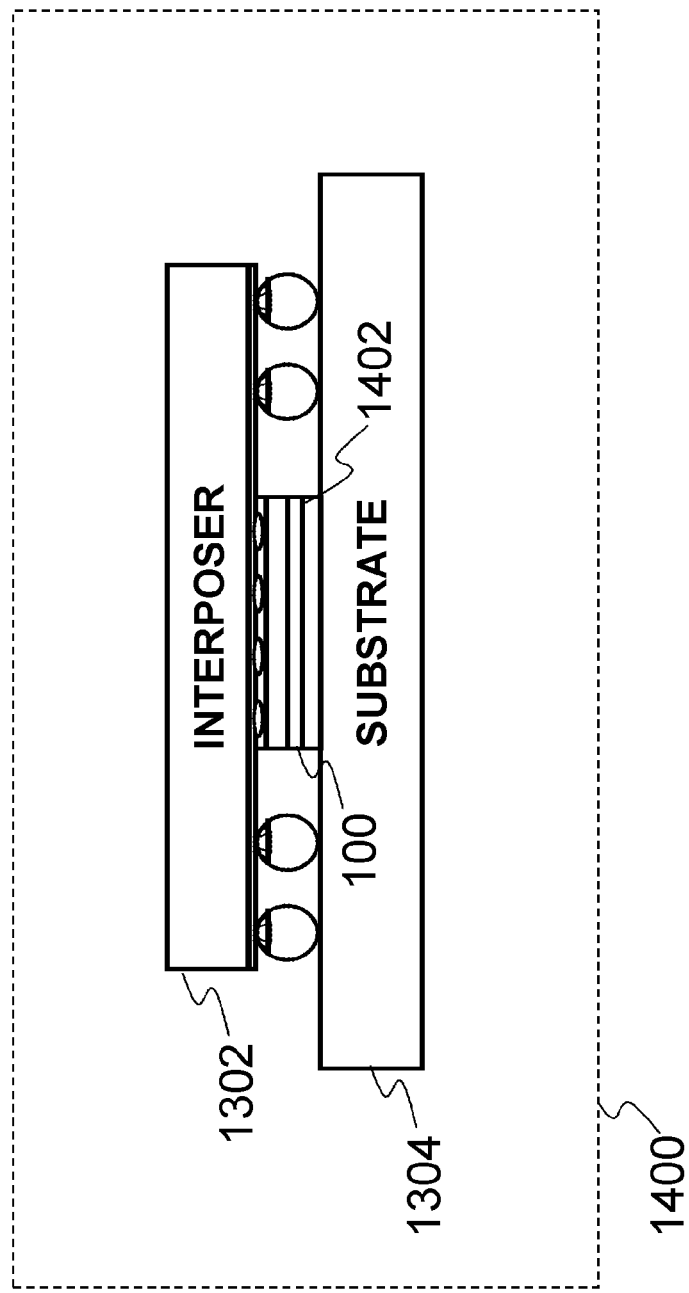

THERMALLY ENHANCED STRUCTURE FOR MULTI-CHIP DEVICE

This application is a divisional of U.S. patent application Ser. No. 13/224,487, entitled "Thermally Enhanced Structure for Multi-Chip Device," filed on Sep. 2, 2011, which application is incorporated herein by reference.

BACKGROUND

Since the invention of the integrated circuit, the semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area.

As semiconductor technologies evolve, three dimensional (3D) integrated circuits (ICs) emerge as an effective alternative to further reduce the physical size of a semiconductor chip. In a 3D IC based semiconductor chip, active circuits are fabricated on different wafers and each wafer die is stacked on top of another wafer die using pick-and-place techniques. Much higher density can be achieved by employing 3D IC. Furthermore, 3D ICs can achieve smaller form factors, cost-effectiveness, increased performance and lower power consumption.

A 3D IC device may comprise a top active circuit layer, a bottom active circuit layer and a plurality of inter-layers. One of the inter-layers may be an interposer. In a 3D IC, two dies may be bonded together through a plurality of micro bumps. As a result, a variety of active circuit layers may be stacked together in a 3D IC without an interposer. However, interposers in 3D ICs are still widely used because an interposer, as a relatively large silicon layer, can accommodate various wafer dies different in size. More particularly, interposers can bond various wafer dies together by using micro-bumps. Furthermore, by employing an interposer, the complicated thermal distribution issue of a 3D IC can be simplified.

A 3D IC may comprise a variety of semiconductor dies, each of which may generate an excessive amount of heat during normal operation. As a result, excessive amounts of heat may be generated when the variety of semiconductor dies are placed in a high density IC package. The excessive amounts of heat may decrease the thermal performance of the 3D IC.

BRIEF DESCRIPTION OF THE DRAWINGS

For a more complete understanding of the present invention, and the advantages thereof, reference is now made to the following descriptions taken in conjunction with the accompanying drawings, in which:

FIG. 2A illustrates a cross sectional view of a semiconductor die with a heat sink in accordance with an embodiment;

FIG. 2B illustrates two top views of the heat sink shown in FIG. 2A;

FIG. 2C illustrates a cross sectional view of another semiconductor die with a heat sink in accordance with another embodiment;

FIG. 2D further illustrates three top views of the heat sink shown in FIG. 2C;

FIGS. 4-10A are cross sectional views of intermediate stages in the making of a multi-chip semiconductor device in accordance with an embodiment;

FIG. 14 illustrates an alternative implementation of the heat sink shown in FIG. 13.

Corresponding numerals and symbols in the different figures generally refer to corresponding parts unless otherwise indicated. The figures are drawn to clearly illustrate the relevant aspects of the various embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, a thermally enhanced structure for a multi-chip semiconductor device. The invention may also be applied, however, to a variety of three dimensional integrated circuits.

Figure 1:
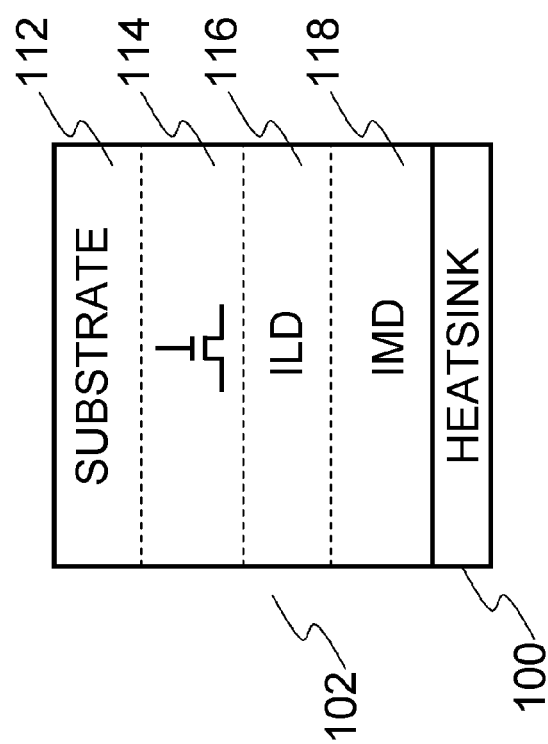
FIG. 1 illustrates a cross sectional view of a semiconductor die with a heat sink in accordance with an embodiment.

Referring initially to FIG. 1, a cross sectional view of a semiconductor die with a heat sink is illustrated in accordance with an embodiment. The semiconductor die 102 may comprise a substrate layer 112, an active circuit layer 114, an inter-layer dielectric (ILD) layer 116 and an inter-metal dielectric (IMD) layer 118. As shown in FIG. 1, the heat sink 100 is formed underneath the IMD layer 118. The ILD layer 116 is formed between the IMD layer and the active circuit layer 114. The substrate layer 112 is on top of the active circuit layer 114. It should be noted that while FIG. 1 illustrates that the substrate layer 112 is on top of the active circuit layer 114, the active circuit layer 114 is formed on top of the substrate layer 112. FIG. 1 illustrates a cross sectional view of the semiconductor die 102 based upon a flip chip die configuration. The process of fabricating a flip chip die is well known in the art, and hence is not discussed in detail herein.

The substrate layer 112 may comprise bulk silicon, doped or undoped, or an active layer of a semiconductor-on-insulator (SOI) substrate. Generally, an SOI substrate comprises a layer of a semiconductor material, such as silicon, formed on an insulator layer. The insulator layer may be, for example, a buried oxide (BOX) layer or a silicon oxide layer. The insulator layer is provided on a substrate, typically a silicon or glass substrate. Other substrates, such as a multi-layered or gradient substrate may also be used.

The active circuit layer 114 is formed on top of the substrate layer 112. While FIG. 1 illustrates a single transistor symbol in the active circuit layer 114, the active circuit layer 114 may comprise a variety of n-type metal oxide semiconductor (NMOS) transistors and/or p-type metal oxide semiconductor (PMOS) transistors. Furthermore, a variety of semiconductor devices such as diodes, capacitors, resistors and the like may be formed based upon the combination of one or more NMOS and/or PMOS transistors.

In accordance with an embodiment, the ILD layer 116 may be formed of a low-K dielectric material. The low-K dielectric material may comprise silicon oxide, phosphosilicate glass, borophosphosilicate glass, fluorinated silicate glass, $SiO_xC_y$, Spin-On-Glass, Spin-On-Polymers, silicon carbon material, compounds thereof, composites thereof, combinations thereof or the like. The dielectric material may be deposited by spinning, chemical vapor deposition (CVD) or plasma-enhanced CVD (PECVD) techniques. It should be noted that in an embodiment, an etch stop layer (not shown) may be formed between the active circuit layer 114 and the ILD layer 116 using CVD or PECVD techniques. The function of an etch stop layer is well known in the art, and hence is not discussed to avoid repetition.

The IMD layer 118 may comprise a plurality of metallization layers (not shown). Generally, one or more metallization layers are used to interconnect various active circuits in the active circuit layer 114 and further provide electrical connections between the active circuit layer 114 and external circuits (not shown). The IMD layer 118 may also comprise one or more layers of a low-K dielectric material, such as fluorosilicate glass, which is formed by PECVD techniques, high-density plasma chemical vapor deposition (HDPCVD) techniques or the like. The IMD layer 118 may also include one or more passivation layers as is known in the art.

The heat sink 100 may be formed of a conductive material such as copper, silver, gold, tungsten, aluminum, combinations thereof or the like. A variety of deposition methods such as Physical Vapor Deposition (PVD) by sputtering, evaporation, PECVD and electroplating can be used to form the heat sink 100. As shown in FIG. 1, the heat sink 100 is formed directly adjacent to the semiconductor die 102 so as to reduce the junction temperature of the semiconductor die 102. As a result, the heat sink 100 may help to dissipate the heat generated from the semiconductor die 102. In comparison with a semiconductor die not having a heat sink, the semiconductor die 102 benefits from the heat dissipation from the heat sink 100 so that the reliability and performance of the semiconductor die 102 may be improved. In accordance with an embodiment, the thickness of the heat sink 100 is in a range from 5 μm to 50 μm. It should be noted that the range of the thickness of the heat sink is selected purely for demonstration purposes and are not intended to limit the various embodiments of the present disclosure to any particular thickness. One of ordinary skill in the art would recognize many variations, alternatives, and modifications.

FIG. 2A illustrates a cross sectional view of a semiconductor die with a heat sink in accordance with an embodiment. The semiconductor die 102 and the heat sink 100 have been described above with respect to FIG. 1, and hence are not discussed in detail to avoid repetition. FIG. 2B further illustrates two top views of the heat sink 100 shown in FIG. 2A. As shown in FIG. 2A, the heat sink 100 is directly formed on the IMD layer 118. As described above, one of the functions of the IMD layer 118 is that the IMD layer 118 provides a plurality of connection paths between external circuits (not shown) and the active circuit layer 114. As a result, the heat sink 100 cannot be a solid metal or ceramic or other thermally conductive material block, which may prevent external circuits from accessing the active circuit layer 114. Instead, FIG. 2B shows two possible embodiments of the heat sink 100 when the heat sink 100 is formed on the front side of the semiconductor die 102.

A top view 212 shows the heat sink 100 may be a metal block having a variety of openings. The variety of openings 213 may comprise signal vias, thermal vias, thermal openings and signal openings. More particularly, a signal via may be an opening on the heat sink 100, through which a signal path between external circuits (not shown) and the active circuit layer 114 is built. A thermal via may have the same shape as the signal via but electrically coupled to the heat sink 100. The heat in the heat sink 100 may be further spread through a plurality of thermal vias physically coupled to the heat sink 100. A signal opening may be a rectangular shaped opening as shown in FIG. 2B. There may be various reasons to have a signal opening. For example, there is a metal pad (not shown) on the IMD layer 118. The signal opening may allow the metal pad to connect with external circuits (not shown) without a short circuit between the metal pad and the heat sink 100. As such, the signal opening may have various shapes in consideration of various shapes of the metal pads on the IMD layer 118.

It should be noted that while FIG. 2B illustrates a rectangular shaped signal opening, there may be various variations, alternatives and modifications. A thermal opening may have the similar shape as the signal opening. However, the thermal opening is punched due to different reasons. For example, in order to balance the thermal dissipation of a semiconductor die, a heat sink may be designed to have a plurality of openings so that the heat can be distributed on the semiconductor die evenly. In particular, on a hot spot of a semiconductor die, the semiconductor die is fully covered by the heat sink. In contrast, on a less heated portion of the semiconductor die, an opening on the heat sink may lead to a balanced thermal distribution in the semiconductor die 102.

A top view 214 illustrates another alternative heat sink pattern. As shown in FIG. 2B, the heat sink 100 can be further divided into one or more pieces. While the top view 214 shows the heat sink 100 may be divided into two rectangular shaped heat sinks placed next to each other, a person ordinary in the art will recognize that the number of heat sinks illustrated herein is limited solely for the purpose of clearly illustrating the inventive aspects of the various embodiments. The present disclosure is not limited to any specific number of heat sinks.

FIG. 2C illustrates a cross sectional view of another semiconductor die with a heat sink in accordance with another embodiment. The semiconductor die 202 has the same structure as that of the semiconductor die 102. However, the heat sink 100 in FIG. 2C is attached to the backside of the semiconductor die 202. The formation and material of the heat sink 100 have been described above with respect to FIG. 2A, and hence are not discussed in detail to avoid repetition. FIG. 2D further illustrates three top views of the heat sink 100 shown in FIG. 2C. As shown in FIG. 2D, the top views 224 and 226 are similar to the top views 212 and 214, and hence are not discussed in detail herein. The top view 222 indicates that the heat sink 100 is a solid metal block. In other embodiments, the heat sink 100 could be a thermally conductive non-metal material block. Because the substrate layer 112 of the semiconductor die 202 is connected with the heat sink 100, it is not necessary to provide a plurality of connection paths between external circuits (not shown) and the substrate layer 112. As a result, the heat sink 100 can be a solid metal block, which may help to efficiently dissipate the heat in comparison with patterned heat sinks (e.g., top view 212 or top view 214).

Figure 3:
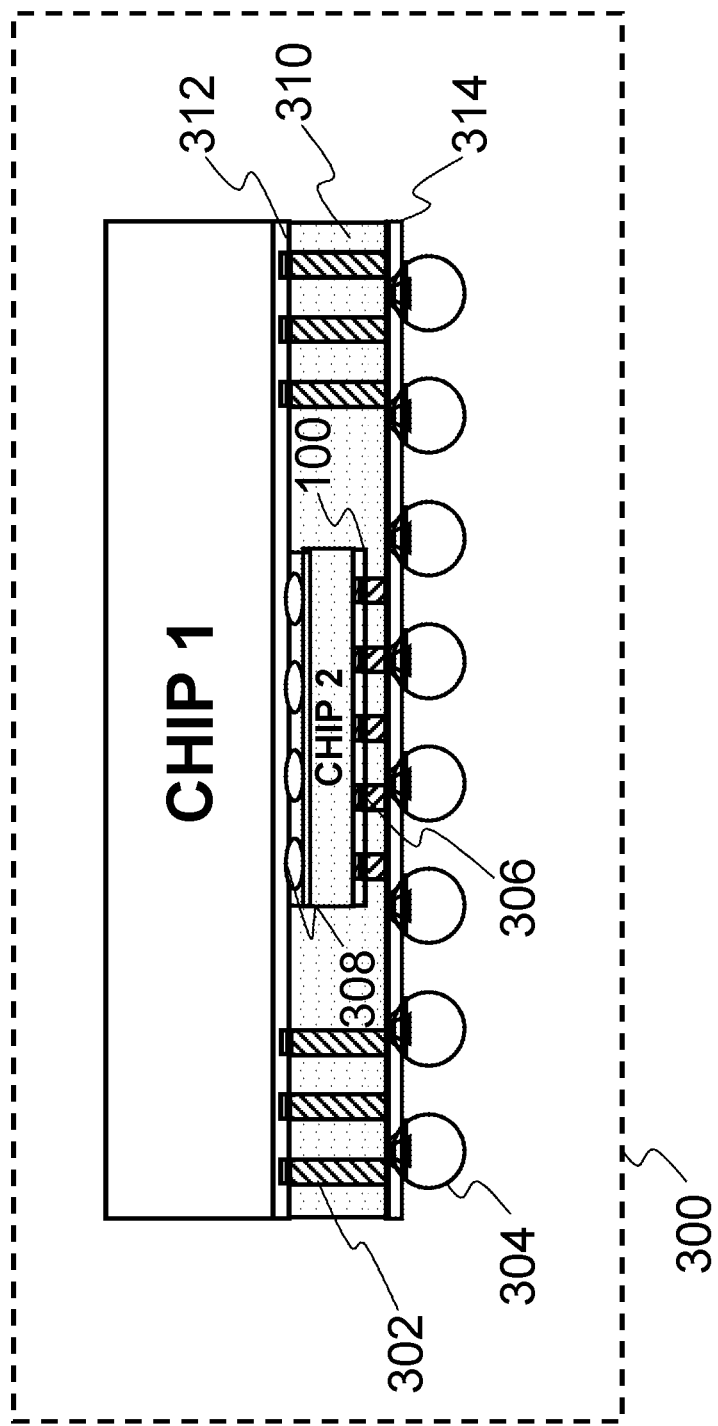
FIG. 3 illustrates a cross sectional view of a multi-chip semiconductor device in accordance with an embodiment.

FIG. 3 illustrates a cross sectional view of a multi-chip semiconductor device in accordance with an embodiment. The multi-chip semiconductor device 300 comprises a first semiconductor die CHIP 1 and a second semiconductor die CHIP 2. As shown in FIG. 3, the first semiconductor die CHIP 1 and the second semiconductor die CHIP 2 are stacked together through a plurality of micro bumps 308 to form the multi-chip semiconductor device 300. The multi-chip semiconductor device 300 further comprises a plurality of solder balls 304 as input/output (I/O) pads mounted on the backside of the multi-chip semiconductor device 300 through a plurality of under bump metallization (UBM) structures. In order to give a basic insight of the inventive aspects of various embodiments, the first semiconductor die CHIP 1 and the second semiconductor die CHIP 2 are drawn without details. However, it should be noted both the first semiconductor die CHIP 1 and the second semiconductor die CHIP 2 may comprise active circuit layers, substrate layers and IMD layers (not shown). The active circuit layer of the first semiconductor die CHIP 1 is coupled to the active circuit layer of the second semiconductor die CHIP 2 through a plurality of micro bumps 308. Furthermore, a redistribution layer (RDL) 312 is formed on top of the IMD layer of the first semiconductor die CHIP 1 so that the metal pads (not shown) of the first semiconductor die CHIP 1 can be connected with the micro bumps 308 through the metal traces provided by the RDL 312.

The second semiconductor die CHIP 2 further comprises a heat sink 100 formed on the backside of the second semiconductor die CHIP 2. As described above with regard to FIG. 2C, the heat sink 100 helps to dissipate the heat generated in the CHIP2. In addition, a plurality of thermal vias 306 are formed between the heat sink 100 and another RDL 314, which is formed on the backside of the multi-chip semiconductor device 300. The plurality of thermal vias 306 can further spread the heat from the second semiconductor die CHIP 2 so as to reduce the junction temperature of the multi-chip semiconductor device 300. As shown in FIG. 3, there may be a plurality of copper pillars 302 between the first semiconductor die CHIP 1 and the RDL 314. The RDL 314 helps to connect the active circuit layer of the first semiconductor die CHIP 1 and/or the active circuit layer of the second semiconductor die CHIP 2 with a plurality of solder balls 304 mounted on the backside of the multi-chip semiconductor device 300. The multi-chip semiconductor device 300 further comprise an encapsulation material layer 310 formed on the first semiconductor die CHIP 1 and the second semiconductor die CHIP 2. The encapsulation material layer 310 may be formed of epoxy molding compounds, spin-on glass (SOG), Polybenzoxazole (PBO), Benzocyclobutene (BCB) or the like.

Figure 4:
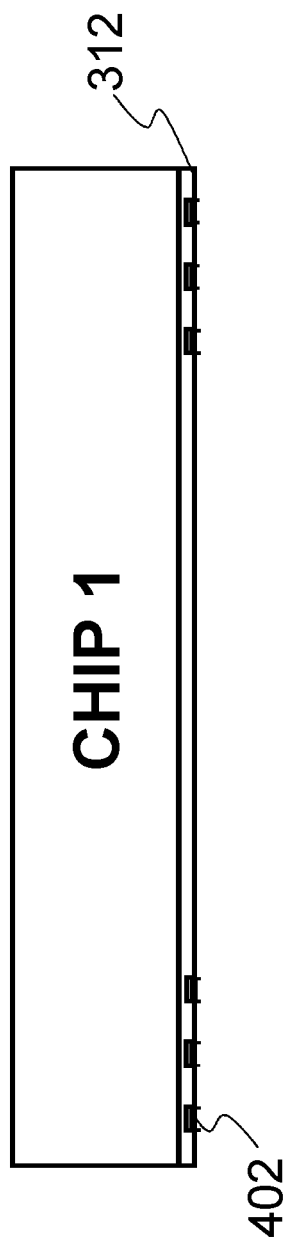
Figure 5:
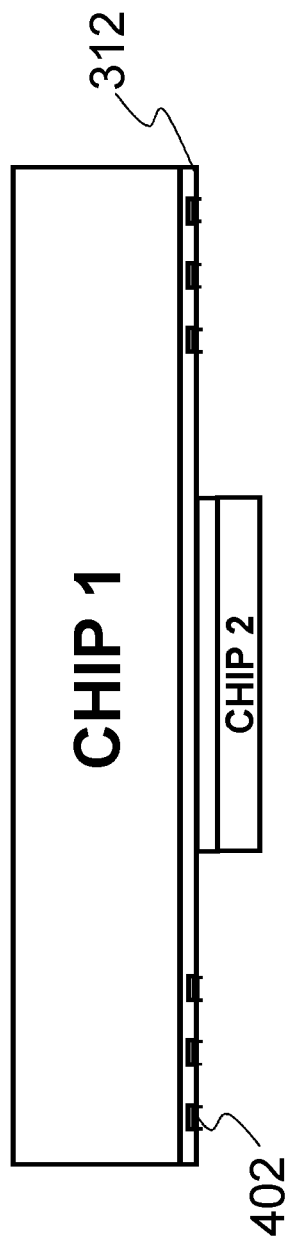

FIGS. 4-10A are cross sectional views of intermediate stages in the making of a multi-chip semiconductor device in accordance with an embodiment. FIG. 4 illustrates a cross sectional view of a first semiconductor die CHIP 1. The first semiconductor die CHIP 1 may comprise a RDL layer 312 formed on a first surface of the first semiconductor die CHIP1. The first semiconductor die CHIP 1 may further comprise a plurality of metal pads 402, whose connections are redistributed through the RDL layer 312. FIG. 5 illustrates a cross sectional view of a stacked die structure. A second semiconductor die CHIP 2 is adhered by epoxy materials to the first surface of the first semiconductor die CHIP 1. As shown in FIG. 5, there may be no electrical connections between the active circuit layer of the first semiconductor die CHIP 1 and the active circuit layer of the second semiconductor die CHIP 2 because there is an epoxy compound layer between the first semiconductor die CHIP 1 and the second semiconductor die CHIP 2. Alternatively, if there is a face-to-face connection between the first semiconductor die CHIP 1 and the second semiconductor die CHIP 2, a plurality of micro bumps may be placed between the first semiconductor die CHIP 1 and the second semiconductor die CHIP 2, such as illustrated in FIG. 3.

Figure 6:
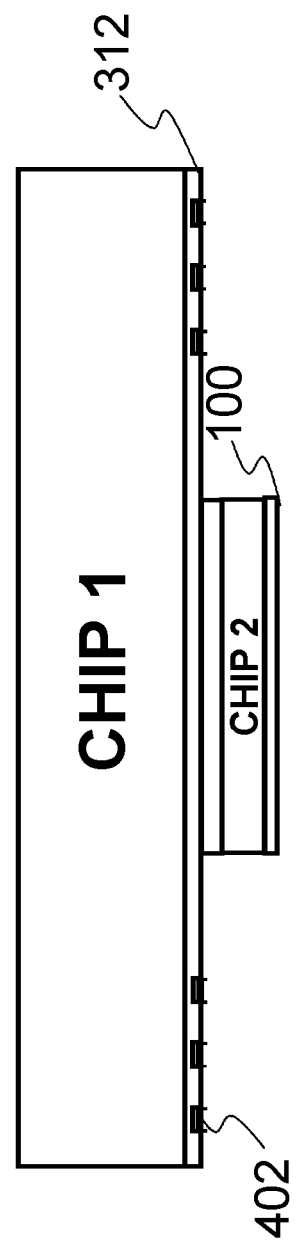
Figure 7:
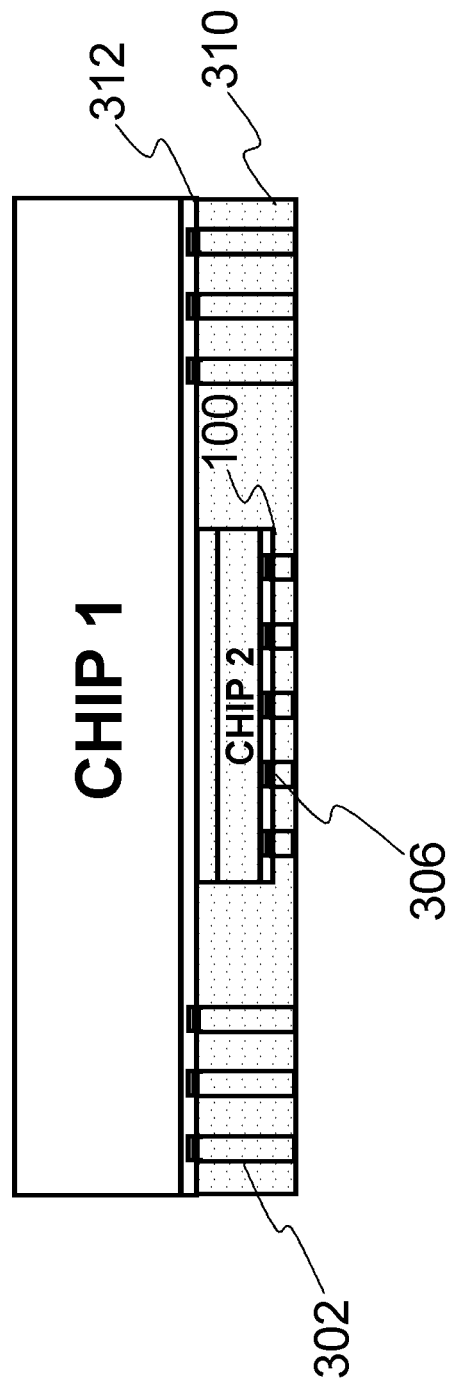

FIG. 6 illustrates a heat sink 100 formed on the front side of the second semiconductor die CHIP 2. Various deposition methods can be employed to form the heat sink 100. As known in the art, PVD by sputtering, evaporation, PECVD and electroplating are well known methods of forming a metal block on the front side of a die, and hence are not discussed in further detail to avoid repetition. FIG. 7 illustrates an encapsulation material layer. An encapsulation material 310 is covered on top of both the first semiconductor die CHIP 1 and the second semiconductor die CHIP 2. Subsequently, in consideration of electrical and thermal needs, a variety of openings having different depths are formed. More particularly, a first group of long openings 302 is formed underneath the first semiconductor die CHIP 1 and a second group of short openings 306 is formed underneath the second semiconductor die CHIP 2.

Figure 8:
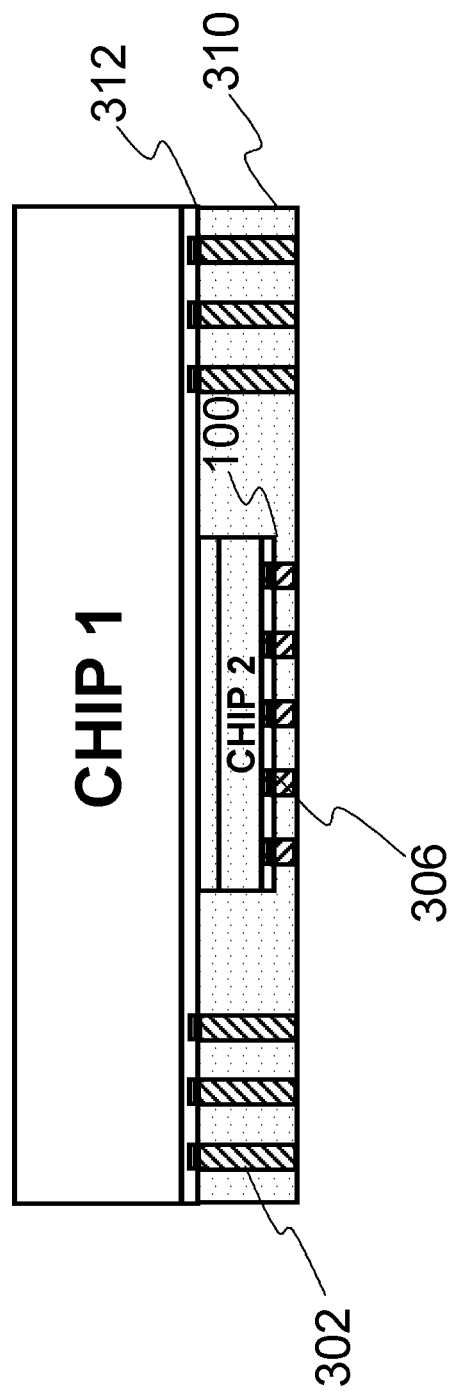
Figure 9:
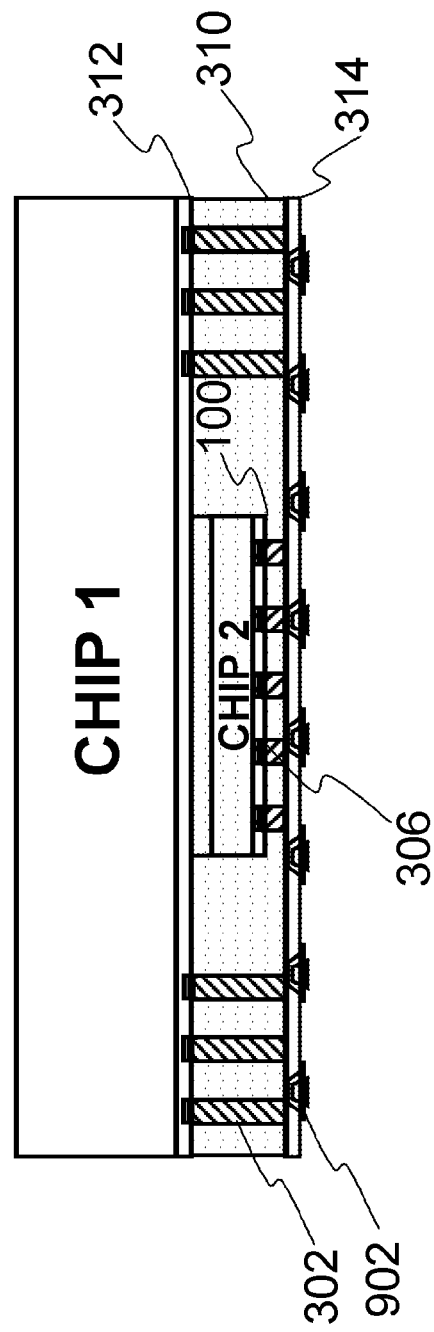
Figure 10A:
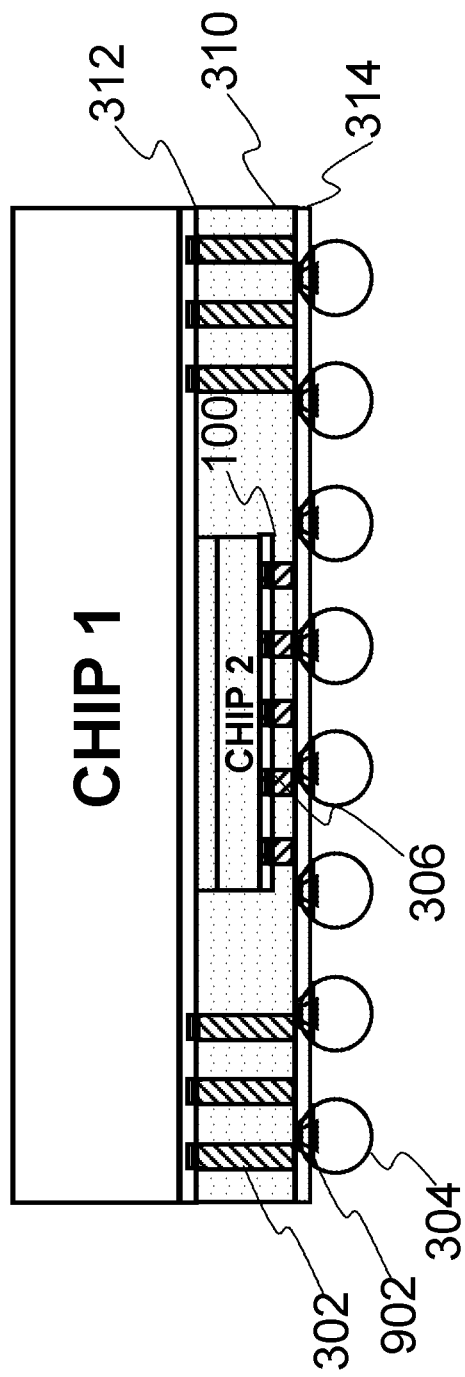
Figure 10B:
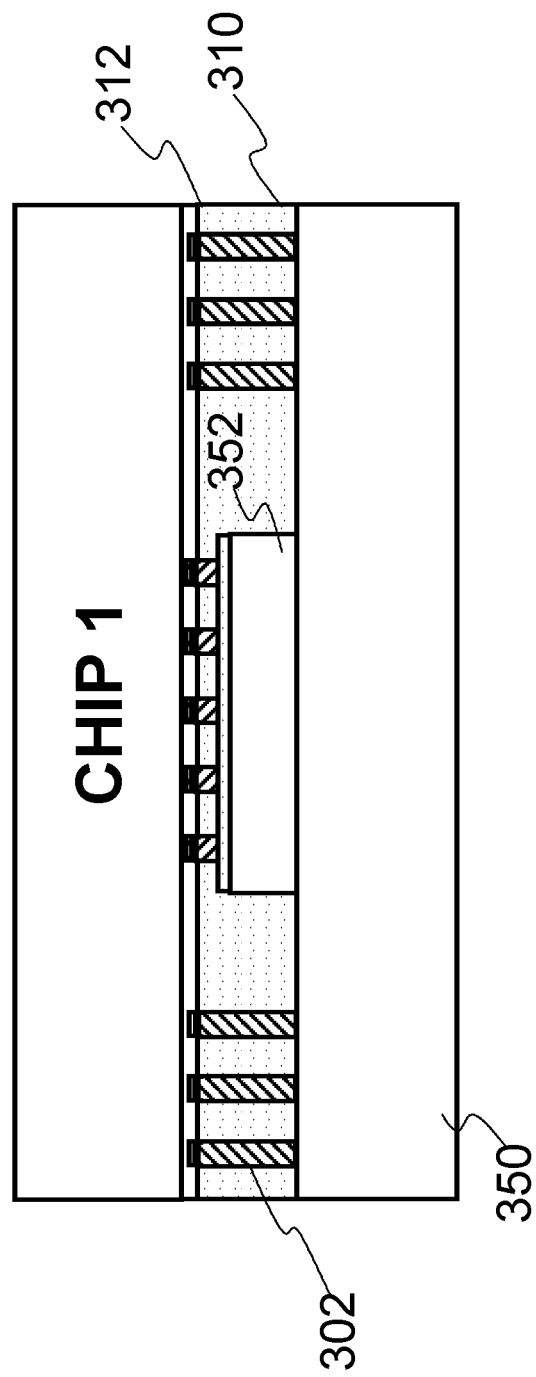
FIG. 10B illustrates another multi-chip semiconductor device in accordance with another embodiment.

FIG. 8 illustrates the formation of copper pillars. As shown in FIG. 8, a conductive material fills the openings 302 and 306. The conductive material may be copper, but can be any suitable conductive materials, such as copper alloys, aluminum, tungsten, silver and combinations thereof. The copper pillars may be formed by means of a plating mechanism. A chemical mechanical planarization process is performed on a surface of the conductor layer so that a substantially smooth surface can be achieved. FIG. 9 illustrates the formation of UBM structures. In order to redistribute the electrical connections from the copper pillars 302 and 306, a RDL layer 314 may be formed on the encapsulation material layer 310. Furthermore, a plurality of UBM structures is formed between the RDL layer 314 and solder balls (not shown but illustrated in FIG. 10A). The UBM structures help to prevent diffusion between the solder balls and the integrated circuits of the multi-chip semiconductor device, while providing a low resistance electrical connection. FIG. 10A illustrates a plurality of solder balls formed on the UBM structures. The process of forming solder balls are well known in the art and, thus, are not repeated herein. FIG. 10B illustrates a cross sectional view of a multi-chip semiconductor device in accordance with another embodiment. As shown in FIG. 10B, a lower mold 350 comprises a cuboid shaped cavity 352. The cuboid shaped cavity 352 allows a semiconductor die to be placed subsequently. In other words, the semiconductor die can be tested first and then, if the semiconductor die passes the test, it will be placed into the cavity. It should be noted that the heat sink shown in FIGS. 2A-2D is applicable to the multi-chip semiconductor device shown in FIG. 10B.

Figure 11:
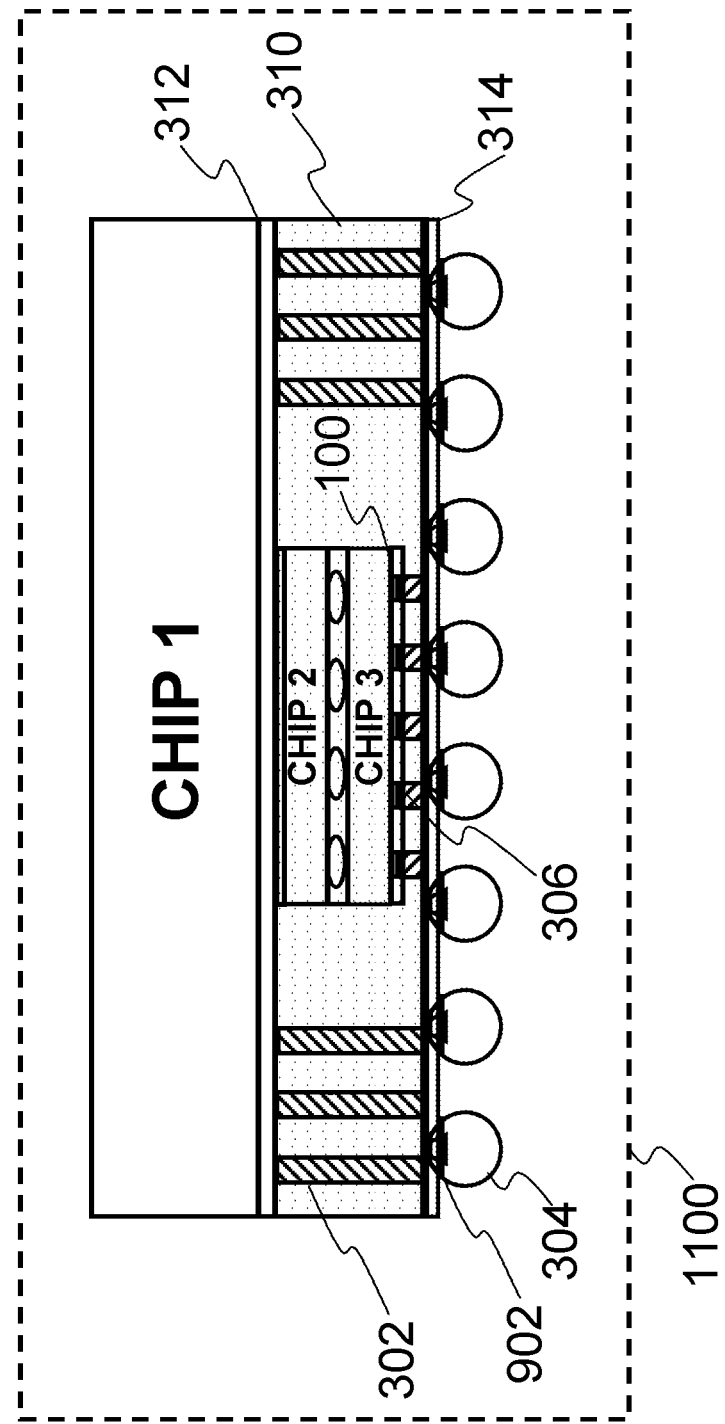
FIG. 11 illustrates another multi-chip semiconductor device in accordance with another embodiment.

FIG. 11 illustrates another multi-chip semiconductor device in accordance with another embodiment. As shown in FIG. 11, the majority of FIG. 11 is similar to that of FIG. 3 except that there is one additional die (a third semiconductor die CHIP 3) stacked underneath the second semiconductor die CHIP 2. The third semiconductor die CHIP 3 and the second semiconductor die CHIP 2 are electrically coupled through a plurality of micro bumps placed between the second semiconductor die CHIP 2 and the third semiconductor die CHIP 3. In addition, the heat sink 100 is formed on the backside of the third semiconductor die CHIP3. The process of forming a multi-chip semiconductor device (e.g., multi-chip semiconductor device 1100) has been described in detail with respect to FIGS. 4-10, and hence is not repeated herein.

Figure 12:
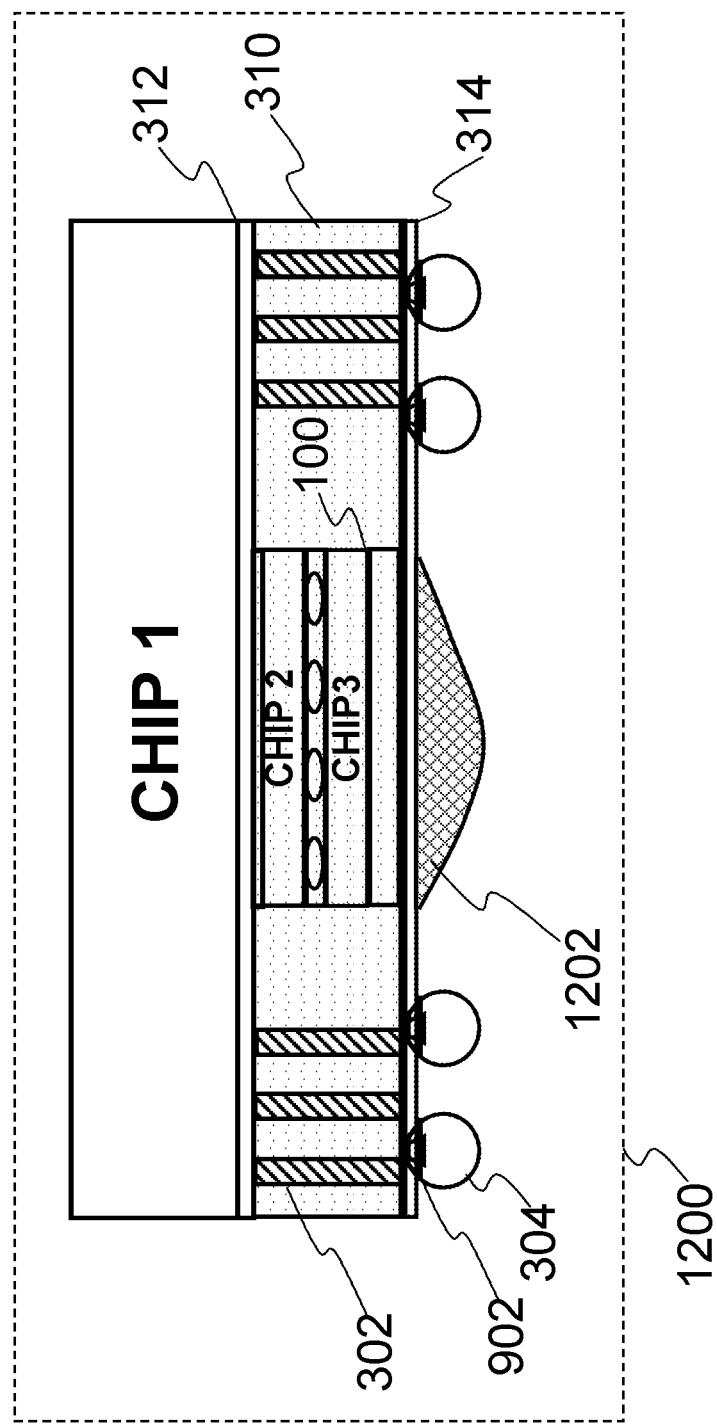
FIG. 12 illustrates another multi-chip semiconductor device in accordance with yet another embodiment.

FIG. 12 illustrates another multi-chip semiconductor device in accordance with yet another embodiment. As shown in FIG. 12, the majority of FIG. 12 is similar to that of FIG. 11 except that a plurality of thermal vias 306 (not shown but illustrated in FIG. 11) are replaced by a solid heat sink. As described above with respect to FIG. 11, the heat sink 100 is mounted on the backside of the third semiconductor die CHIP 3. There may be no electrical connections between the backside of the third semiconductor die CHIP 3 and the RDL 314. As a result, the thermal vias 306 can be removed and the heat sink 100 can be extended to touch the RDL 314. Furthermore, a solder ball 1202 may be attached to the RDL 314. By employing the solder ball 1202, the heat generated from the multi-chip semiconductor device 1200 can be further dissipated when the multi-chip semiconductor device is placed on a PCB board (not shown).

Figure 13:
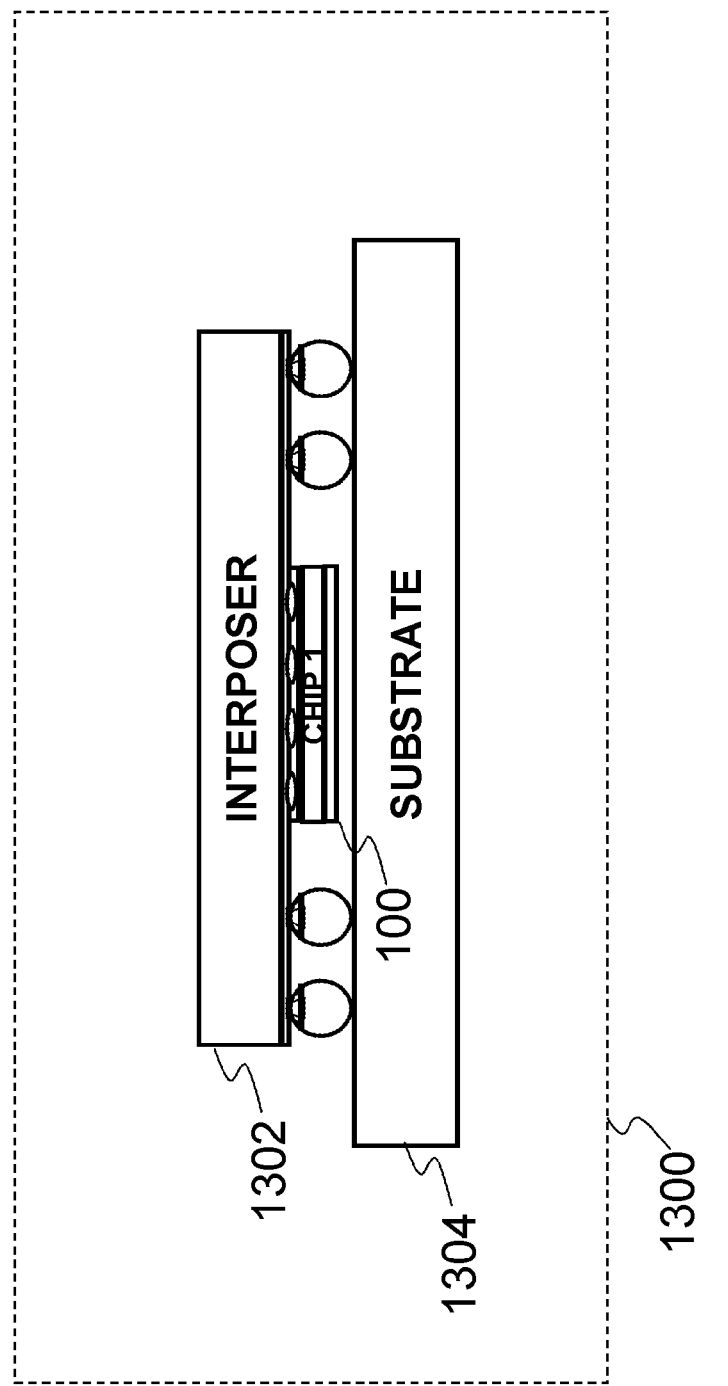
FIG. 13 illustrates a cross sectional view of another multi-chip semiconductor device in accordance with another embodiment.

FIG. 13 illustrates a cross sectional view of another multi-chip semiconductor device in accordance with another embodiment. The multi-chip semiconductor device 1300 comprises an interposer 1302, a first semiconductor die CHIP 1 and a substrate layer 1304. The first semiconductor die CHIP 1 is electrically coupled to the interposer 1302 through a plurality of micro bumps placed between them. The interposer 1302 may comprise a RDL layer to redistribute the connections of its metal pads. Furthermore, the substrate 1304 is electrically coupled to the interposer 1302 through a plurality of solder balls formed between the interposer 1302 and the substrate layer 1304. A heat sink 100 is formed on the backside of the semiconductor die CHIP 1. As explained with respect to FIG. 2C and FIG. 2D, the heat sink 100 in FIG. 13 can be a solid metal block or a metal block having various patterns such as thermal openings and thermal vias. Other thermally conductive materials can be used for the heat sink 100 as well.

FIG. 14 illustrates an alternative implementation of the heat sink shown in FIG. 13. In FIG. 13, there may be a gap between the heat sink 100 and the top side of the substrate layer 1304. In order to further spread the head through the substrate layer 1304, one additional heat sink 1402 may be added between the heat sink 100 and the substrate layer 1304 so as to fill the gap. It should be noted that while FIG. 14 shows one additional heat sink 1402 is formed between the heat sink 100 and the substrate layer 1304, alternatively, the thickness of the heat sink 100 can be increased to a level such that the bottom side of the heat sink 100 touches the top side of the substrate 1304. Furthermore, a solder ball can be formed between the heat sink 100 and the top side of the substrate layer 1304. One advantageous feature of having a thermally efficient path (e.g., a solder ball or one additional heat sink) formed between the first semiconductor die CHIP 1 and the substrate layer 1304 is that the junction temperature of the first semiconductor die CHIP 1 can be further reduced so that the thermal performance of the multi-chip semiconductor device 1400 is improved.

Although embodiments of the present invention and its advantages have been described in detail, it should be understood that various changes, substitutions and alterations can be made herein without departing from the spirit and scope of the invention as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method comprising:
   attaching a heat sink block to a first side of a first semiconductor die, wherein a length of the heat sink block is equal to a length of the first semiconductor die;
   bonding a second side of the first semiconductor die to an interposer; and
   bonding the interposer to a substrate, wherein the first semiconductor die is located between the interposer and the substrate.

2. The method of claim 1, wherein:
   the heat sink block is attached to a backside surface of the first semiconductor die; and
   the heat sink block has a plurality of openings.

3. The method of claim 1, further comprising:
   placing one additional heat sink between the heat sink block and the top surface of the substrate.

4. The method of claim 1, further comprising:
   coupling the first semiconductor die to the interposer through a plurality of micro bumps placed between the first semiconductor die and the interposer.

5. The method of claim 1, further comprising:
   coupling the interposer to the substrate through a plurality of solder balls placed between the substrate and the interposer.

6. The method of claim 1, further comprising:
   forming a solder joint structure between the heat sink block and the top surface of the substrate.

7. The method of claim 1, wherein:
   the heat sink block has a first side attached to the first side of the first semiconductor die; and
   the heat sink block has a second side in direct contact with a top surface of the substrate.

8. A method comprising:
   attaching a first surface of a first semiconductor die to a first surface of a second semiconductor die;
   attaching a heat sink to a second surface of the first semiconductor die;
   forming an encapsulation material layer on the first semiconductor die and the second semiconductor die;
   forming a plurality of via openings in the encapsulation material layer;
   filling a conductive material into the via openings;
   forming a redistribution layer on the encapsulation material layer;
   forming a plurality of under bump metallization structures on the redistribution layer; and
   forming a plurality of solder balls on the plurality of under bump metallization structures.

9. The method of claim 8, further comprising:
   forming a third semiconductor die;
   attaching the third semiconductor die to the first semiconductor die via a plurality of micro bumps;
   extending the heat sink such that a side of the heat sink opposite the first semiconductor die touches a first surface of the redistribution layer; and
   forming a solder ball attached to a surface of the second redistribution layer.

10. The method of claim 8, further comprising:
    forming a variety of thermal openings in the heat sink; and
    forming a variety of thermal vias in the heat sink.

11. A method comprising:
    providing a first chip with a first redistribution layer;
    attaching a first side of a second chip to the first chip;
    forming a heat sink on a second side of the second chip;

forming an encapsulation layer over the first chip, wherein the second chip is embedded in the encapsulation layer; and forming a plurality of vias in the encapsulation layer.

12. The method of claim 11, further comprising:

attaching the first side of the second chip to the first chip through an epoxy layer.

13. The method of claim 11, further comprising:

forming a face-to-face connection between the first chip and the second chip, wherein a plurality of micro bumps are formed between the first chip and the second chip.

14. The method of claim 11, further comprising:

forming first openings extending from a top surface of the encapsulation layer to a top surface of the first chip; and forming second openings extending from the top surface of the encapsulation layer to a top surface of the second chip.

15. The method of claim 14, further comprising:

filling the first openings with a conductive material to form first vias; and filling the second openings with the conductive material to form second vias.

16. The method of claim 11, wherein:

the heat sink has a plurality of openings.

17. The method of claim 11, further comprising:

forming a second redistribution layer over a top surface of the encapsulation layer.

18. The method of claim 17, further comprising:

forming a plurality of under bump metallization (UBM) structures over the second redistribution layer.

* * * * *